United States Patent [19]

Ozawa et al.

[11] Patent Number: 4,566,040

[45] Date of Patent: * Jan. 21, 1986

[54] ORIGINAL READING DEVICE

[76] Inventors: Takashi Ozawa; Mutsuo Takenouchi, both of c/o Fuji Xerox Co., Ltd., Ebina Works, No. 2274, Hongo, Ebina-shi, Kanagawa, Japan

[*] Notice: The portion of the term of this patent subsequent to Jan. 3, 2001 has been disclaimed.

[21] Appl. No.: 506,265

[22] Filed: Jun. 21, 1983

[30] Foreign Application Priority Data

Oct. 4, 1982 [JP] Japan .................. 57-175455

[51] Int. Cl.$^4$ .................. G06K 9/00; H04N 3/14
[52] U.S. Cl. .................. 358/293; 377/60; 358/213
[58] Field of Search .................. 377/54, 60, 61, 76; 358/213, 293, 294

[56] References Cited

U.S. PATENT DOCUMENTS

| 3,989,956 | 11/1976 | Walden | 377/60 |
|---|---|---|---|
| 4,120,035 | 10/1978 | Cases et al. | 377/60 |
| 4,313,138 | 1/1982 | Kanda et al. | 358/293 |
| 4,424,590 | 1/1984 | Ozawa | 358/213 |
| 4,449,147 | 5/1984 | Ogasawara | 358/293 |

Primary Examiner—John S. Heyman
Attorney, Agent, or Firm—Sughrue, Mion, Zinn, Macpeak & Seas

[57] ABSTRACT

An original reading device of the close-contact type such as may be used in a facsimile system in which the number of interconnections required for the device is made quite small and slow switching times of thin film transistors employed in the device are tolerated. Thin film transistors have input electrodes connected to corresponding photoelectric conversion elements. The thin film transistors are divided into a plurality of ordered groups with gate electrodes of each of the thin film transistors within each group being connected together. A first shift register applies first switching signals to connection points of the gate electrodes of each of the groups in time sequence. Output electrodes of the even- and odd-ordered groups of the thin film transistors are connected to corresponding lines of first and second sets of connecting lines, respectively. Temporary storing means, in the form of stray capacitors, are connected to each of the connecting lines. MOS transistors, which are activated in sequence by a second shift register, transfer the signal charges temporarily stored in the temporary storing means to an output terminal.

4 Claims, 5 Drawing Figures

ORIGINAL READING DEVICE

BACKGROUND OF THE INVENTION

The present invention relates to an original reading device employed in a facsimile system. More particularly, the invention pertains to a close-contact type original reading device.

In general, in a close-contact type original reading device, a plurality of photoelectric conversion elements and a circuit for switchably connected elements in sequence to an output terminal are formed on the same insulating substrate. The length of the photoelectric conversion element array is made equal to the width of an original to be read. The image of the original is transmitted to the array, in an image ratio of 1:1, through an optical fiber array or lens arrangement. In this type of device, the length of the optical path needed for forming an image is reduced, with the result that the size of the original reading device is greatly reduced.

FIG. 1 is a circuit diagram of a conventional close-contact type original reading device. In FIG. 1, reference numeral 10 designates photoelectric conversion elements constructed with a photoconductive film, each element having the equivalent circuit of a photodiode PD and a parallel-connected capacitor. Reference numeral 20 indicates switch elements used for transmitting the output signals of respective ones of the photoelectric conversion elements 10, reference numeral 30 indicates parasitic capacitors which are formed by the stray capacitances of leads connecting the photoelectric conversion elements 10 to the switch elements 20 and the input capacitances of the switch elements 20, 40 a charge transmitting circuit, 50 a load resistance, and 60 a bias source. The charge transmitting circuit 40 is made up of charge storage capacitors 41, charge transmitting switch elements 42 and clock lines 43 and 44.

When the image of an original is formed on the photoelectric conversion elements 10, currents representative of the optical intensities of corresponding portions of the image are generated by the photodiodes PD. These currents cause the storage of charges in the parasitic capacitors 30. The charges on the parasitic capacitors 30 are transmitted to the charge storage capacitors 41 when the switch elements 20 are closed upon supplying a suitable signal to the terminal T1. An alternating voltage is applied to the clock lines 43 and 44 through the terminals T2 and T3 to operate the charge transmitting switch elements 42 successively. The signal charges thus transmitted are shifted (to the right in FIG. 1), and are thus discharged through the load resistor 50, thereby producing an output voltage at the terminal T4. This arrangement may be termed a BBD (Bucket Brigade Device).

The above-described switch elements 20 and charge transmitting switch elements 42 may be MOS transistors manufactured using ordinary integrated circuit techniques. An MOS transistor is suitable as a switch element in an original reading device in that it has a relatively high switching speed and is operable on a relatively low voltage. However, in order to realize the above-described close-contact type original reading device, it is necessary that the photoelectric conversion elements 10 and IC chips including the switch elements 20 and the charge transmitting circuits 40 be mounted on the same substrate and be connected by wire bonding or the like, with the result that the number of connections per original reading device is considerably large. This is a great obstacle to reducing the manufacturing cost of the device and improving its reliability.

The above-described difficulty may be eliminated by employing a technique whereby the switch elements 20 and the charge transmitting circuit 40 are formed using thin film transistors. That is, the switch elements 20 and the charge transmitting circuit 40 are formed using the same process as the photoelectric conversion elements 10. This solves the above-described problem. However, the device so constructed still suffers drawbacks in practical use in that a thin film transistor has a much lower switching speed than an MOS transistor manufactured with integrated circuit techniques. Moreover, it cannot operate on a low voltage. This is, its operating characteristics are still insufficient to make such a transistor fully acceptable as a switch element in an original reading device.

In view of the foregoing, an object of the present invention is to provide an original reading device in which the advantages of both thin film transistors and MOS transistors are effectively realized so that an original reading device is provided which can read an original document at high speed and with high reliability, but which has a simple structure and can be manufactured at a low cost.

SUMMARY OF THE INVENTION

In the original reading device of the invention, film transistors provided for respective photoelectric conversion elements are divided into a plurality of groups with the gate electrodes of the thin film transistors in each group connected together. Switching signals are applied to the connection points of the gate electrodes in a time sequential mode. The output electrodes of the film transistors in odd-ordered groups are connected in a predetermined order through a first set of common connecting lines, while the output electrodes of the film transistors in even-ordered groups are connected in a predetermined order through a second set of common connecting lines. Means for temporarily storing photoelectric signals are provided for the common connecting lines, and photoelectric conversion signals stored in the temporary storing means by the above-described switching operation are read by switch circuits composed of MOS transistors.

Accordingly, in obtaining the outputs of the photoelectric conversion elements, the film transistor switching time can be made to correspond to a period of time equal to the reading times of a plurality of photoelectric conversion elements, thus making the relatively slow switching film transistors fully acceptable for this purpose. Furthermore, the overall speed of producing the output signals is determined by the MOS transistor switching speed as described above. In addition, the number of connecting lines is minimized to a number which is equivalent to the number of common connecting lines extending to the output electrodes of the film transistors.

DESCRIPTION OF THE PREFERRED EMBODIMENTS

Preferred embodiments of an original reading device constructed according to the present invention will be described with reference to the accompanying drawings.

Figure 1:
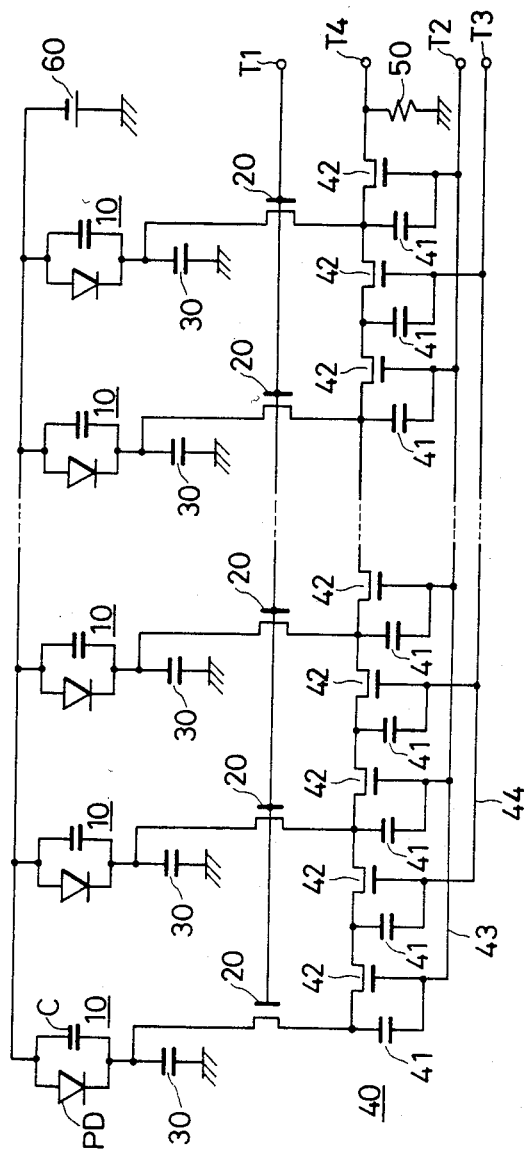
FIG. 1 is an equivalent circuit diagram of a conventional original reading device.
Figure 2:
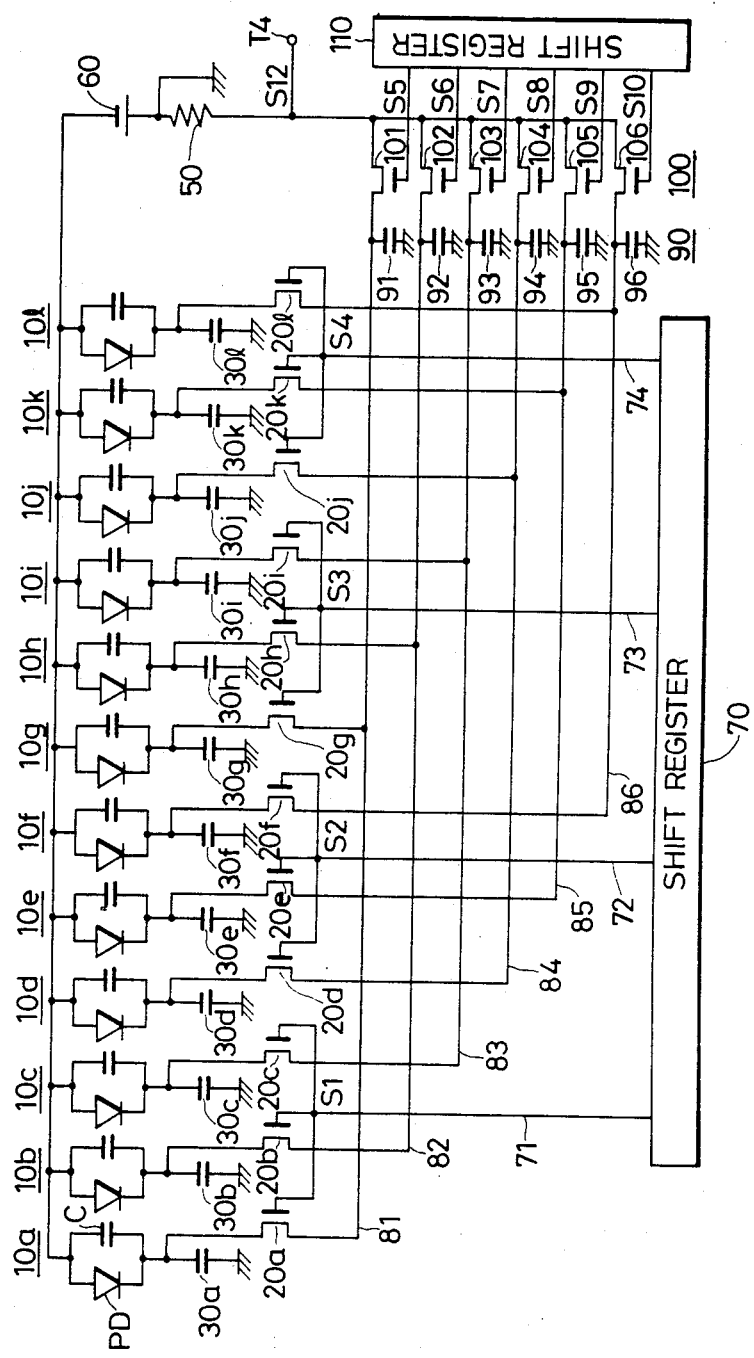
FIG. 2 is an equivalent circuit diagram of an example of an original reading device according to the invention.

FIG. 2 is a circuit diagram of an original reading device of the invention, which is, for convenience in description, one having 12 photoelectric conversion elements. In FIG. 2, elements and circuits corresponding functionally to those already described with reference to FIG. 1 are designated by like reference numerals or characters, and duplicate descriptions therefore will be omitted.

In FIG. 2, reference characters $10a$ through $10l$ designate equivalent circuits of photoelectric conversion elements. Switch elements $20a$ through $20l$, which are implemented with thin film transistors, are connected to the photoelectric conversion elements $10a$ through $10l$, respectively. The switch elements $20a$ through $20l$ are divided into several groups (three groups in the example), and the gates of the switch elements in each group are connected together. The gates thus connected in groups are connected to respective output lines 71 through 74 of a shift register 7.

The output electrodes of the switch elements $20a$ through $20c$ and $20g$ through $20i$ of the odd-numbered (odd-ordered) groups are connected to common connecting lines 81, 82 and 83, respectively. Similarly, the output electrodes of the switch elements $20d$ through $20f$ and $20j$ through $20l$ of the even-numbered (even-ordered) groups are connected to common connecting lines 84, 85 and 86, respectively. The common connecting lines 81 through 86 are connected to input electrodes of MOS transistors 101 through 106, respectively, with parasitic capacitors 91 through 96, respectively, being associated with respective lines 81 through 86. The parasitic capacitors 91 through 96 are combinations of the output capacitances of the switch elements (thin film transistors) $20a$ through $20l$, the stray capacitances of the common connecting lines 81 through 86, and the input capacitances of the MOS transistors 101 through 106. The gate electrodes of the MOS transistors 101 through 106 are connected to the output terminals of a shift register 110, and the output electrodes thereof are connected together.

In the original reading device so constructed, signal charges stored on the parasitic capacitors $30a$ through $30l$ are transferred to respective ones of the parasitic capacitors 91 through 96 when the switch elements $20a$ through $20l$, respectively, are turned on. Thereafter, the MOS transistors 101 through 106 are driven by the shift register 110 so that the signals are outputted upon the output terminal T4.

Figure 3:
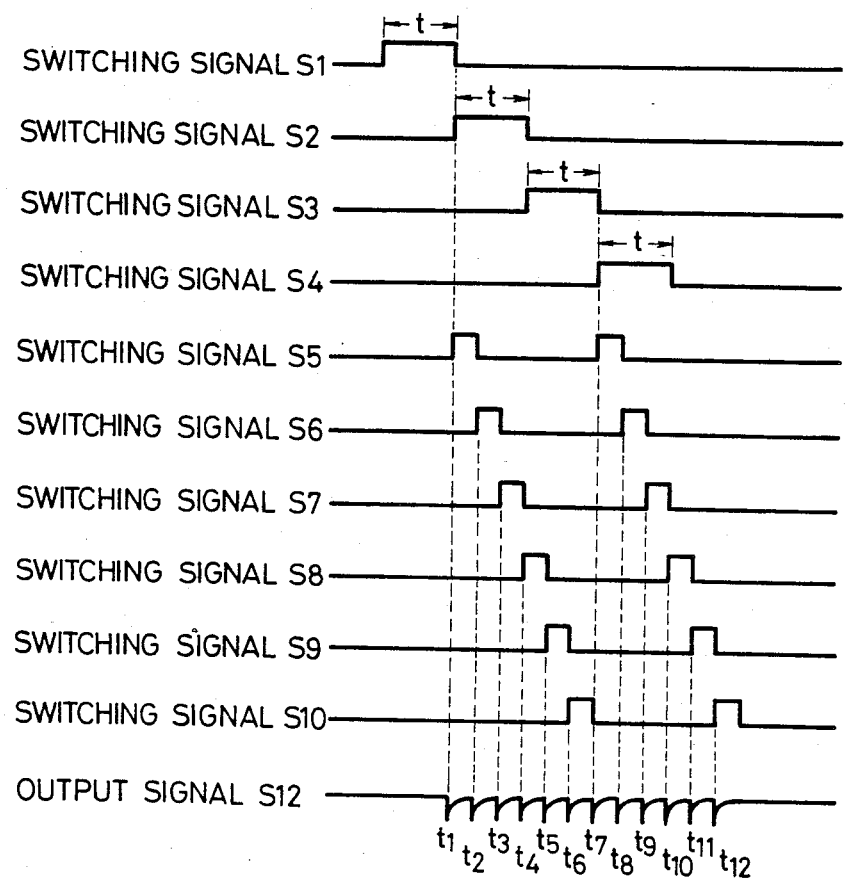
FIG. 3 is a timing chart used in a description of an example of the operation of the device of FIG. 2.

The operation of this device will be described further with reference to the timing chart of FIG. 3. It should be noted that the operation to be described should be performed only after sufficient signal charge has accumulated on the parasitic capacitors $30a$ through $30l$.

First, the shift register 70 is operated to apply a switching signal S1 to the output line 71. As a result, the switch elements $20a$, $20b$ and $20c$ are turned on, whereupon the charges on the parasitic capacitors $30a$, $30b$ and $30c$ are transferred to the parasitic capacitors 91, 92 and 93, respectively, through the common connecting lines 81, 82 and 83, respectively. In this case, the time width of the switching signal S1 should be long enough for the complete charge to be transferred. The parasitic capacitors 91 through 96 are much larger in capacitance than the parasitic capacitors $30a$ through $30c$. Thus, the signal charges are transferred to capacitors 91, 92, 93 rapidly and completely.

When the switching signal S2 is applied to the output line 72 of the shift register 70, the switch elements $20d$, $20e$ and $20f$ are turned on, as a result of which the signal charges on the parasitic capacitors $30d$, $30e$ and $30f$ are transferred to the parasitic capacitors 94, 95 and 96, respectively. At the same time, the shift register 110 applies switching signals S5, S6 and S7 to the gate electrodes of the MOS transistors 101, 102 and 103 successively, that is, in a time-sequential manner, so that the MOS transistors 101, 102 and 103 are successively rendered conductive to successively transfer the charges stored on the capacitors 91, 92 and 93 to the output terminal T4, thereby producing components of the output signal S12 at time instants $t_1$, $t_2$ and $t_3$.

When the charges have been fully transferred from the capacitors 91, 92 and 93, a switching signal S3 is applied to the output line 73 of the shift register 70 so that switch elements $20g$, $20h$ and $20i$ are turned on. As a result, the signal charges on the parasitic capacitors $30g$, $30h$ and $30i$ are delivered to the capacitors 91, 92 and 93, respectively. That is, the capacitors 91, 92 and 93 are charged again. At the same time, the shift register 110 applies switching signals S8, S9 and S10 to the gate electrodes of the MOS transistors 104, 105 and 106 in a time sequential manner to render the MOS transistors 104, 105 and 106 successively conductive. As a result, the charges stored on the capacitors 94, 95 and 96 are delivered to the terminal T4 in succession at time instants $t_4$, $t_5$ and $t_6$ indicated in FIG. 3.

After the charges have been transferred out of the capacitors 94, 95 and 96 as described above, a switching signal S4 is applied to the output line 74 of the shift register 70 to turn on the switch elements $20j$, $20k$ and $20l$ so that the signal charges on the parasitic capacitors $30j$, $30k$ and 30 are transferred to the parasitic capacitors 94, 95 and 96 which have been discharged as described above. At the same time, the shift register 110 applies the switching signals S5, S6 and S7 to the MOS transistors 101, 102 and 103 in time sequence to render the MOS transistors 101, 102 and 103 conductive in succession so that the charges stored again on the capacitors 91, 92 and 93 are delivered to the output terminal T4 at time instants $t_7$, $t_8$ and $t_9$.

When the charges have been delivered from the capacitors 91, 92 and 93 as described above, finally the shift register 110 applies the switching signals S8, S9 and S10 again to the gate electrodes of the MOS transistors 104, 105 and 106 in time sequence to render the MOS transistors 104, 105 and 106 conductive, whereupon the charges which have been stored on the capacitors 94, 95 and 96 are once more delivered to the output terminal T4, here at time instants $t_{10}$, $t_{11}$ and $t_{12}$. All signals have then been read out.

As is apparent from the above description, in the signal reading device of the invention, the operation time of the switch elements $20a$ though $20l$ is long, several reading time periods of a single photoelectric conversion element, thereby overcoming the abovedescribed difficulties which are inherent in thin film transistors related to their low switching speed and high on resistance. Furthermore, as the final read out of the signals to the outside is carried out by MOS transistors (101 though 106) which operate at a high speed, all bits can be read in a very short time. In addition, since the switch elements 20a through 20l and the common connecting lines 81 through 86 can be formed on the same substrate using the same thin or thick film which forms the photoelectric conversion elements 10, connection of the photoelectric conversion elements to the switching is not required. Further, as in the conventional device, wire bonding or the like must be employed to connect the switch elements 20a through 20l to the output lines 71 through 74 of the shift register 70 and to connect the common connecting lines 81 through 86 to the MOS transistors 101 through 106. However, the number of wires so needed is very small. For instance, in a case where the device includes 2,048 photoelectric conversion elements and the 2,048 photoelectric conversion elements are divided into 32 groups so that the gate electrodes of 64 switch elements in each group are connected together, the number of connecting wires between the switch elements and the charge transmitting means is 128, which is about 1/20 that of the conventional device of FIG. 1.

Figure 4A:
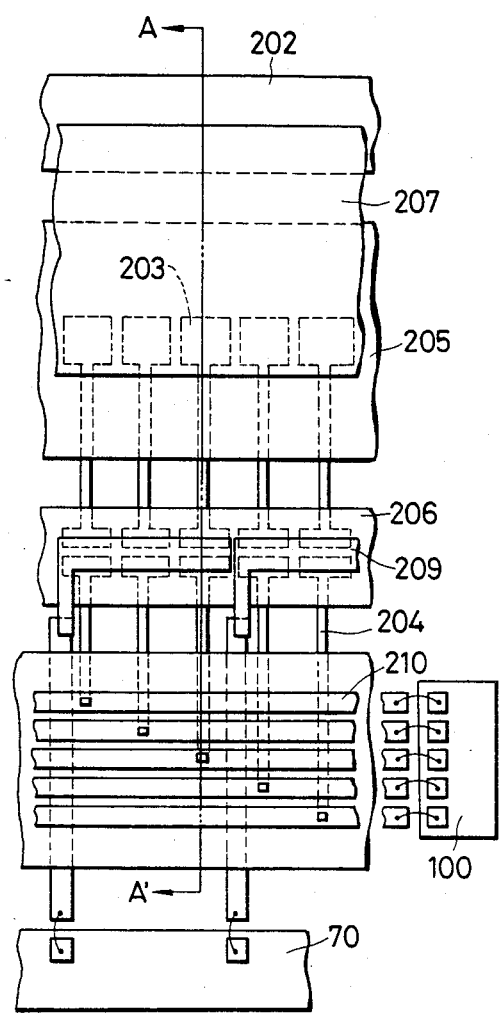
FIGS. 4A and 4B are a plan view and a sectional view, respectively, showing an example of the physical structure of an original reading device according to the invention.
Figure 4B:
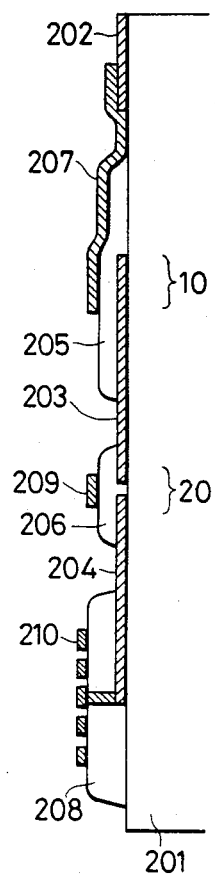

FIGS. 4A and 4B show the physical structure of the above-described device, of which FIG. 4B is a cross-sectional view taken along a line A—A in FIG. 4A.

In this example of a reading device of the invention, a substrate 201 is an insulating glass or a ceramic substrate, the surface of which has been glazed. A film of metal such as chromium, gold, aluminum or nickel is formed on the substrate 201 to a thickness of from 1000 ÅA to 5000 ÅA by electron beam vacuum evaporation. Then electrodes 202, 203 and 204 are formed in a predetermined pattern using photolithography. In order for the formed electrodes to have good adhesion strength to the substrate 201, it is desirable to form the electrodes with a film of chromium. Then, a film or a semiconductor material such as amorphous silicon, polycrystalline silicon, selenium, selecium - tellurium, selenium - arsenic, selenium - arsenic - tellurium or cadmium sulfide, cadmium selenide or zinc - selenium, or zinc - cadmium - tellurium is formed on the electrodes 203 and 204 by masking and vacuum evaporation so that a photoconductive film 205 and a semiconductor film 206 are formed. It is desirable that the films 205 and 206 be formed by a layer of amorphous silicon which is formed to a thickness of 0.1 to 1 $\mu$m by the glow discharge of silane gas. Thereafter, a transparent, electrically conductive film 207 is formed to a thickness of 1500 ÅA by DC sputtering of ITO ($I_{n2}O_3$ and $S_nO_2$), which is then trimmed to a predetermined configuration by photolithography or by masking vacuum evaporation. In this manner, photoelectric conversion elements (10) are formed in such a manner that the electrodes 203 overlap the transparent electrically conductive film 207.

In FIG. 4, reference numeral 208 designates an insulating film of silicon dioxide, silicon nitride or glass. The insulating film 208 is formed by vacuum evaporation, photolithography or thick film printing. Throughholes are formed therein for wiring multiple layers at predetermined positions. A thin or thick film of chromium, gold, aluminum or nickel is formed in a predetermined pattern to form gate electrodes 209 and common conductors 210. Thus, thin film transistors are formed below the gate electrodes 209. The ends of the electrodes 209 and the common conductors 210 are connected to the shift register 70 and the MOS transistors (100) by wire bonding. However, they may be connected also by soldering or with a tape carrier.

As is clear from the above description, in the original reading device of the invention, undesirable characteristics of thin film transistors are rendered ineffective. Thus, with the device, an original document can be read stably and quickly. Moreover, since the number of connecting lines is small, the device of the invention is improved in reliability and can be manufactured at a low cost.

We claim:

1. An original reading device in which a plurality of lower electrodes are formed on a substrate, and photoconductors and transparent, electrically conductive upper electrodes are formed on said lower electrodes to form photoelectric conversion elements, comprising:
   a plurality of thin film transistors, one of said thin film transistors being provided for each of said photoelectric conversion elements, each of said photoelectric conversion elements being coupled to an input electrode of a corresponding one of said film transistors, and said film transistors being divided into a plurality of alternating even- and odd-ordered groups with gate electrodes of each of said film transistors in each group being connected together;
   a first shift register for applying first switching signals to connection points of said gate electrodes of each said group in time sequence;
   a first set of connecting lines through which the output electrodes of ones of said thin film transistors in said odd-ordered groups are connected in a predetermined order;
   a second set of connecting lines through which output electrodes of said thin film transistors in said even-ordered groups are connected in a predetermined order;
   a plurality of temporary storing means, one of said temporary storing means being provided for each of said first and second connecting lines, for temporarily storing the switched photoelectric conversion outputs;
   a plurality of MOS transistors, one of said MOS transistors being provided for and having an input electrode coupled to each of said temporary storing means for reading said photoelectric conversion outputs thus temporarily stored, said MOS transistors having output electrodes connected together; and
   a second shift register for applying second switching signals to gate electrodes of said MOS transistors in time sequence.

2. The original reading device of claim 1, wherein each of said temporary storing means comprises a stray capacitor associated with a corresponding line of said first and second sets of connecting lines.

3. The original reading device of claim 2, wherein each of said photoelectric conversion elements has associated therewith, connected to an electrode thereof to which the corresponding one of said film transistors is connected, a second stray capacitor, and wherein a capacitance value of the first-mentioned stray capacitor is greater than a capacitance value of said second stray capacitor.

4. The original reading device of claim 1, wherein said first shift register applies said first switching signals each with an active state for a time period corresponding to a plurality of reading periods for individual ones of said photoelectric conversion elements.

* * * * *